(12) United States Patent
Li et al.

(10) Patent No.: US 9,500,904 B2
(45) Date of Patent: Nov. 22, 2016

(54) LIGHT VALVE DEVICE, INFRARED DISPLAY APPARATUS, DEDICATED SPECTACLES AND SYSTEM

(71) Applicant: BOE TECHNOLOGY GROUP CO., LTD., Beijing (CN)

(72) Inventors: Wenbo Li, Beijing (CN); Dongsheng Wang, Beijing (CN); Youmei Dong, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 179 days.

(21) Appl. No.: 14/235,902

(22) PCT Filed: Aug. 14, 2013

(86) PCT No.: PCT/CN2013/081439
§ 371 (c)(1),
(2) Date: Jan. 29, 2014

(87) PCT Pub. No.: WO2014/205896
PCT Pub. Date: Dec. 31, 2014

(65) Prior Publication Data
US 2015/0153595 A1    Jun. 4, 2015

(30) Foreign Application Priority Data

Jun. 28, 2013 (CN) .......................... 2013 1 0268669

(51) Int. Cl.
*G02F 1/1335* (2006.01)
*G02F 1/00* (2006.01)
(Continued)

(52) U.S. Cl.
CPC ........... *G02F 1/1336* (2013.01); *G02F 1/0045* (2013.01); *G02F 1/1337* (2013.01); *G02F 1/1343* (2013.01);
(Continued)

(58) Field of Classification Search
CPC ...................................................... G02F 1/1336
(Continued)

(56) References Cited

U.S. PATENT DOCUMENTS 7,400,370 B2 * 7/2008 Kim .................... G02F 1/13473
349/115
8,444,264 B1   5/2013 Kross et al.
(Continued)

FOREIGN PATENT DOCUMENTS

CN    1338656       3/2002
CN    1338656 A     3/2002
(Continued)

OTHER PUBLICATIONS

CN 20131026866984 1st Office Action, English Translation.
(Continued)

*Primary Examiner* — Sang V Nguyen
(74) *Attorney, Agent, or Firm* — Brooks Kushman P.C.

(57) ABSTRACT

The present invention discloses a light valve device, an infrared display apparatus, dedicated spectacles and a system, to realize with naked eyes, only a black picture plane without any information can be seen on a display screen, but with spectacles, effective image information can be seen on the display screen; as a result, the image display is more concealed. The light valve device comprises a first liquid crystal cell and a second liquid crystal cell that are oppositely disposed to each other; the first liquid crystal cell and the second liquid crystal cell are both formed by two substrates that are oppositely arranged, and alignment films with parallel or antiparallel alignment directions are formed on the inside the two substrates respectively; cholesteric liquid crystals with opposite arrangement and rotation directions are filled in the first liquid crystal cell and the second liquid crystal cell respectively.

10 Claims, 5 Drawing Sheets

(51) Int. Cl.
*G02F 1/1337* (2006.01)
*G02F 1/1343* (2006.01)
*G02F 1/1347* (2006.01)
G02C 7/10 (2006.01)
H01L 51/50 (2006.01)

(52) U.S. Cl.
CPC ......... *G02F 1/1347* (2013.01); *G02F 1/13473* (2013.01); *G02F 1/133526* (2013.01); *G02C 7/101* (2013.01); *G02F 2001/13478* (2013.01); *G02F 2001/133624* (2013.01); *G02F 2203/11* (2013.01); *H01L 51/5028* (2013.01)

(58) Field of Classification Search
USPC ..................................................... 349/74, 96
See application file for complete search history.

(56) References Cited

U.S. PATENT DOCUMENTS

| | | | |
|---|---|---|---|
| 9,006,752 B2 | 4/2015 | So et al. | |
| 2008/0123025 A1* | 5/2008 | Li | G02F 1/13471 349/74 |
| 2012/0286296 A1* | 11/2012 | So | B82Y 10/00 257/82 |
| 2013/0314632 A1* | 11/2013 | Zohrabyan | G02F 1/29 349/36 |
| 2014/0152944 A1* | 6/2014 | Zhao | G02F 1/1347 349/96 |
| 2014/0267977 A1* | 9/2014 | Wilkins | G02F 1/1335 349/61 |
| 2014/0368766 A1* | 12/2014 | Shibata | G02B 5/201 349/61 |

FOREIGN PATENT DOCUMENTS

| | | | |
|---|---|---|---|
| CN | 1727948 | 2/2006 | |
| CN | 1727948 A | 2/2006 | |
| CN | 1881036 A | 12/2006 | |
| CN | 101153980 A | 4/2008 | |
| CN | 101339308 | 1/2009 | |
| CN | 101339308 A | 1/2009 | |
| CN | 102360144 * | 2/2012 | ............... A61F 9/02 |
| CN | 102360144 A | 2/2012 | |
| CN | 102540414 | 7/2012 | |
| CN | 102540414 A | 7/2012 | |
| CN | 102725616 | 10/2012 | |
| CN | 102725616 A | 10/2012 | |
| CN | 102981327 * | 3/2013 | ........... G02F 1/1347 |
| CN | 102981327 A | 3/2013 | |
| CN | 203606599 | 5/2014 | |
| CN | 203606599 U | 5/2014 | |
| JP | 2008249815 A | 10/2008 | |
| WO | 2013044200 A1 | 3/2013 | |

OTHER PUBLICATIONS

First Office Action of corresponding Chinese Application No. CN 2013102686694.4; dated Apr. 10, 2015; 15 pages.
First Office Action of corresponding Chinese Application No. CN 2013102686694; dated Apr. 10, 2015; 12 pages [English Translation].
International Search Report and Written Opinion of corresponding application No. PCT/CN2013/081439; Dated: Mar. 20, 2014; 14 pages.
PCT International Search Report and Written Opinion Dated Mar. 20, 2014, Application No. PCT/CN2013/081439, with English translation of Written Opinion.

* cited by examiner

LIGHT VALVE DEVICE, INFRARED DISPLAY APPARATUS, DEDICATED SPECTACLES AND SYSTEM

CROSS-REFERENCE TO RELATED APPLICATION

This application is the U.S. national phase of PCT Application No. PCT/CN2013/081439 filed on Aug. 14, 2013, which claims priority to Chinese Patent Application No. 201310268669.4 filed on Jun. 28, 2013, the disclosures of which are incorporated in their entirety by reference herein.

BACKGROUND OF THE INVENTION

1. Field of the Invention

The present invention relates to the field of display technologies, and in particular, to a light valve device, an infrared display apparatus, dedicated spectacles and a system.

2. Description of the Prior Art

With the improvement of display technologies, portable display screens come to the fore one after another. At present, there are various types of portable display screen on the market, and people may use a display screen at any time and at any place. However, when a display screen is used in public places, information leakage is prone to occur due to being peeked by others.

At present, an anti-peek display system realizes the anti-peek function by separating the first polarizer sheet on the light incident side from the second polarizer sheet on the light outgoing side of a display screen, and only setting a first polarizer sheet on the light incident side and setting a second polarizer sheet on the lens of spectacles. The polarization directions of the first polarizer sheet and the second polarizer sheet are vertical to each other.

An incident light generates light beams with different polarization directions, and if there exists no second polarizer sheet, people can only see the full white state of the display screen with naked eyes, and no effective image information can be seen.

The second polarizer sheet of the conventional display screen is added to the spectacles, wherein the polarization directions of the optical axes of the polarizer sheets on the right and the left lenses are consistent with each other. Only with the aid of spectacles with the second polarizer sheets can the displayed information on the screen be seen normally, so that the information can be protected highly, and others can be prevented from using or peeking or remotely shooting the information displayed. However, only a full-while picture plane can be seen with naked eyes, and people around may be aware if one watches a while screen with spectacles, thus the display will not be concealed enough.

SUMMARY OF THE INVENTION

The present invention provides a light valve device, an infrared display apparatus, dedicated spectacles and a system, thereby with naked eyes, only a black picture plane without any information can be seen on a display screen, but with spectacles, effective image information can be seen on the display screen; as a result, the image display will be more concealed.

The invention provides a light valve device, comprising: a first liquid crystal cell and a second liquid crystal cell that are oppositely disposed to each other; wherein, the first liquid crystal cell and the second liquid crystal cell are both formed by two substrates that are oppositely arranged, and alignment films with parallel or antiparallel alignment directions are formed on the inside the two substrates respectively;

cholesteric liquid crystals with opposite arrangement and rotation directions are filled in the first liquid crystal cell and the second liquid crystal cell respectively.

Further, the first liquid crystal cell comprises: a first substrate and a second substrate that are oppositely disposed to each other; cholesteric liquid crystal molecules located between the first substrate and the second substrate; a first conductive electrode and a second conductive electrode located on the first substrate and the second substrate respectively for controlling the deflection of liquid crystal molecules in the first liquid crystal cell; and a first alignment film and a second alignment film located on the first conductive electrode and the second conductive electrode respectively;

the second liquid crystal cell comprises: a third substrate and a fourth substrate that are oppositely disposed to each other; cholesteric liquid crystal molecules located between the third substrate and the fourth substrate; a third conductive electrode and a fourth conductive electrode located on the third substrate and the fourth substrate respectively for controlling the deflection of liquid crystal molecules in the second liquid crystal cell; and a third alignment film and a fourth alignment film located on the third conductive electrode and the fourth conductive electrode respectively;

wherein, the first liquid crystal cell is filled with levogyric cholesteric liquid crystal molecules, and the second liquid crystal cell is filled with dexiotropous cholesteric liquid crystal molecules; or, the first liquid crystal cell is filled with dexiotropous cholesteric liquid crystal molecules, and the second liquid crystal cell is filled with levogyric cholesteric liquid crystal molecules;

the alignment direction of the first alignment film is parallel or antiparallel to that of the second alignment film, and the alignment direction of the third alignment film is parallel or antiparallel to that of the fourth alignment film.

Preferably, the second substrate and the third substrate are one and the same substrate, which is a common substrate; and the second conductive electrode and the third conductive electrode are located on the two sides of the common substrate respectively.

The invention further provides an infrared display apparatus, which comprises: a display panel, and an infrared backlight module fixed and connected with the display panel; wherein, the display panel comprises a light valve device;

the light valve device comprises a first liquid crystal cell and a second liquid crystal cell that are oppositely disposed to each other; the first liquid crystal cell and the second liquid crystal cell are both formed by two substrates that are oppositely arranged, and alignment films with parallel or antiparallel alignment directions are formed on the inside the two substrates respectively; cholesteric liquid crystals with opposite arrangement and rotation directions are filled in the first liquid crystal cell and the second liquid crystal cell respectively; and two pixel arrays in one-to-one correspondence are further set in the first liquid crystal cell and the second liquid crystal cell respectively, for controlling the light transmittance of each pixel.

Further, the first liquid crystal cell comprises: a first substrate and a second substrate that are oppositely disposed to each other; cholesteric liquid crystal molecules located between the first substrate and the second substrate; a first conductive electrode and a second conductive electrode located on the first substrate and the second substrate respectively for controlling the deflection of liquid crystal molecules in the first liquid crystal cell; and a first alignment film and a second alignment film located on the first conductive electrode and the second conductive electrode respectively;

the second liquid crystal cell comprises: a third substrate and a fourth substrate that are oppositely disposed to each other; cholesteric liquid crystal molecules located between the third substrate and the fourth substrate; a third conductive electrode and a fourth conductive electrode located on the third substrate and the fourth substrate respectively for controlling the deflection of liquid crystal molecules in the second liquid crystal cell; and a third alignment film and a fourth alignment film located on the third conductive electrode and the fourth conductive electrode respectively;

wherein, the first liquid crystal cell is filled with levogyric cholesteric liquid crystal molecules, and the second liquid crystal cell is filled with dexiotropous cholesteric liquid crystal molecules; or, the first liquid crystal cell is filled with dexiotropous cholesteric liquid crystal molecules, and the second liquid crystal cell is filled with levogyric cholesteric liquid crystal molecules; the alignment direction of the first alignment film is parallel or antiparallel to that of the second alignment film, and the alignment direction of the third alignment film is parallel or antiparallel to that of the fourth alignment film.

Preferably, each pixel in the first liquid crystal cell and the second liquid crystal cell comprises a switching device for controlling on and off of the pixel;

in each pixel of the first liquid crystal cell, the first conductive electrode is a common electrode, which is connected with a supply source, and the second conductive electrode is a pixel electrode, which is electrically connected with a display signal control end via a switching device; and in each pixel of the second liquid crystal cell, the fourth conductive electrode is a common electrode, which is connected with a supply source, and the third conductive electrode is a pixel electrode, which is electrically connected with a display signal control end via a switching device.

Preferably, the second substrate and the third substrate are one and the same substrate, which is a common substrate, and the switching device in the first liquid crystal cell and the switching device in the second liquid crystal cell are located on the two sides of the common substrate respectively.

Preferably, the infrared backlight module comprises an infrared light source, and the infrared backlight module employs a straight down type or side light type infrared light source structure.

The invention provides dedicated spectacles used in conjunction with an infrared display apparatus, wherein the lenses of the dedicated spectacles are light converting lenses that convert infrared light into visible light.

Preferably, the light converting lenses are upconversion lenses made of an upconversion luminescent material; or, the light converting lenses are optical doubling frequency crystal wafers made of optical doubling frequency crystal.

The invention provides a display system, which comprises the above infrared display apparatus and dedicated spectacles.

The invention provides another infrared display apparatus, comprising a display panel, wherein the display panel comprises:

a first substrate and a second substrate that are oppositely disposed to each other;

a pixel array located on a side of the first substrate that is adjacent to the second substrate; and an infrared luminescence device that is set in each pixel region on the first substrate and is connected with each pixel in one-to-one correspondence.

Preferably, each pixel comprises: a switching device for controlling on and off of the pixel; and a pixel electrode connected with the switching device;

one of the cathode and the anode of the infrared luminescence device is connected with the pixel electrode, and the other is connected with a supply source.

Preferably, the infrared luminescence device comprises at least two infrared organic light-emitting diodes or infrared inorganic light-emitting diodes that are connected in series with each other.

Preferably, infrared display apparatus further comprises microlens located on a light-exiting surface of the infrared luminescence device.

The invention provides another display system, which comprises the above another infrared display apparatus and the above dedicated spectacles.

The invention provides an infrared display apparatus and dedicated spectacles for the infrared display apparatus. The dedicated spectacles may convert an infrared display image from the infrared display apparatus into a visible light image that can be seen by human eyes; but for naked eyes, only a normal black display screen of the infrared display apparatus can be seen, so that the image displayed by the infrared display apparatus will be more concealed.

BRIEF DESCRIPTION OF THE DRAWINGS

FIG. 6 is a schematic sectional view of a cholesteric liquid crystal light valve device according to Embodiment 1 of the invention when it is not powered on;

FIG. 8 is a schematic sectional view of the cholesteric liquid crystal light valve device according to Embodiment 1 of the invention when it is powered on;

DETAILED DESCRIPTION OF THE PREFERRED EMBODIMENTS

The invention provides a light valve device, an infrared display apparatus, dedicated spectacles and a system, thereby with naked eyes, only a black picture plane without any information can be seen on a display screen, but with spectacles, effective image information can be seen on the display screen; as a result, the image display will be more concealed.

In the invention, infrared display image is implemented via an infrared display apparatus based on infrared technologies. The invention further provides dedicated spectacles for the infrared display apparatus. The dedicated spectacles may convert an infrared display image from the infrared display apparatus into a visible light image that can be seen by human eyes; but for naked eyes, a normal black display screen of the infrared display apparatus will be seen, so that the image displayed by the infrared display apparatus will be more concealed.

The display system, the dedicated spectacles and the infrared display apparatus according to the invention will be illustrated one by one below in conjunction with the drawings.

Figure 1:
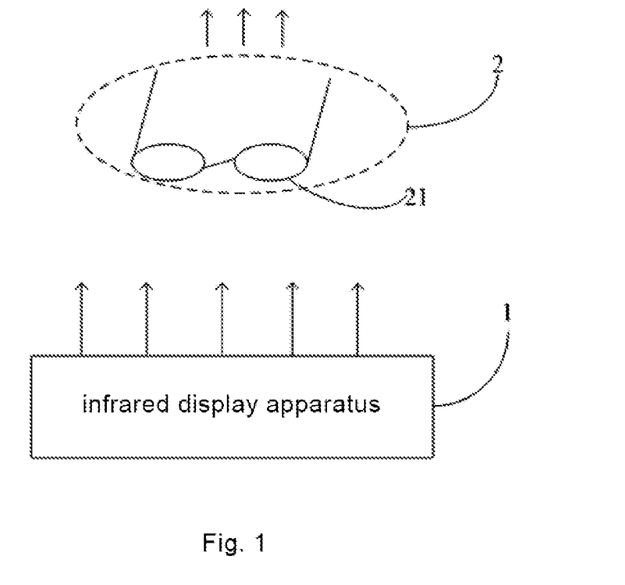
FIG. 1 shows a structural representation of a display system according to an embodiment of the invention.

Referring to FIG. 1, the display system according to the invention comprises:

an infrared display apparatus 1 that can display an infrared image, and dedicated spectacles 2 that is used in conjunction with the infrared display apparatus 1.

The dedicated spectacles 2 according to the invention are dedicated spectacles that may convert infrared light into visible light.

The arrowed line segment in FIG. 1 represents a light beam, the light beam on the light outgoing side of the infrared display apparatus 1 is infrared light, and the light beam transmitted through the dedicated spectacles 2 is visible light.

The lenses of the dedicated spectacles according to the invention are light converting lenses that convert infrared light into visible light.

In the invention, the above light converting lenses may be realized in, but not limited to, the following two modes:

Mode 1:

Preferably, the lenses 21 of the dedicated spectacles 2 shown in FIG. 1 are upconversion lenses. The upconversion lenses may convert infrared light into visible light.

During specific implementation process, the upconversion lenses are made of an upconversion luminescent material. When excited by long-wavelength light (for example, infrared light), the upconversion luminescent material may continuously emit light with a wavelength shorter than the exciting wavelength (for example, visible light).

Preferably, the upconversion luminescent material is mainly a solid compound doped with rare-earth elements, which may absorb a plurality of low-energy long wave radiations by taking advantage of the feature of metastable state energy level of rare-earth elements, so that the infrared light invisible to human eyes may be converted into visible light.

The basic theory by which the upconversion luminescent material converts infrared light into visible light will be illustrated in detail below in conjunction with an energy level diagram of the upconversion luminescent material.

Figure 2:
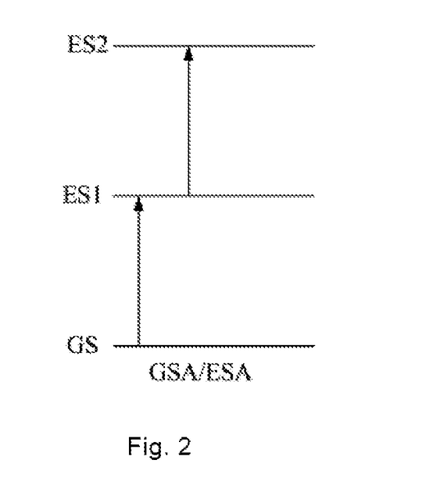
FIG. 2 is the first energy level diagram of an upconversion luminescent material according to an embodiment of the invention.
Figure 3:
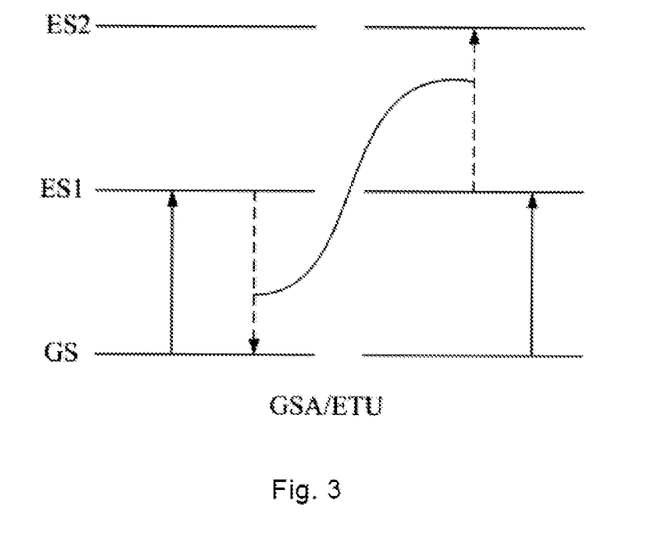
FIG. 3 is the second energy level diagram of the upconversion luminescent material according to an embodiment of the invention.
Figure 4:
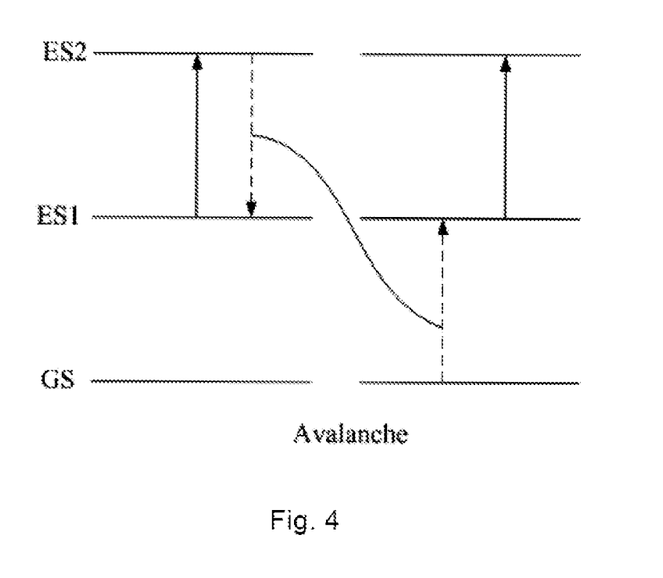
FIG. 4 is the third energy level diagram of the upconversion luminescent material according to an embodiment of the invention.

As shown in FIG. 2 to FIG. 4, the energy level of the upconversion luminescent material at least includes ground state GS, first excited state ES1 and second excited state ES2. The energy band width between the ground state GS and the first excited state ES 1 is basically the same as the energy band width between the first excited state ES 1 and the second excited state ES2. The arrows in FIG. 2 to FIG. 4 represent the transition direction of photons.

As shown in FIG. 2, it shows a ground state absorption (GSA) process and a excited state absorption (ESA) process. Specifically, an ion of the upconversion luminescent material in ground state GS absorbs a photon from the infrared light and turns to metastable excited state (first excited state) ES1, and the ion in first excited state ES1 again absorbs a photon and turns to a higher excited state (second excited state) ES2.

As shown in FIG. 3, it shows a ground state absorption (GSA) process and an energy transfer upconversion (ETU) process. Specifically, two ions in metastable excited state ES1 performs energy transfer in a cross relaxation mode via non-radiation coupling, thus one ion returns to the ground state GS, and the other ion transits to the second excited state ES2. Transition of electrical and magnetic dipoles and relaxation of multiple phonons often exist in this process.

As shown in FIG. 4, it shows a Photon Avalanche Upconversion process. Specifically, such a process has the following features: ions of the upconversion luminescent material perform no ground state absorption on pumped light, but perform excited state absorption and inter-ion cross relaxation; as a result, the layout number of intermediate long-life metastable excited state ES1 increases, effective upconversion occurs, and infrared light is converted to visible light after multiple upconversions.

Preferably, upconversion luminescent materials include halides material system, oxides material system and sulphocompound material system, etc.

Preferably, in the halides material system, fluorine compound may be employed. Preferably, in the fluorine compound system, the upconversion luminescent material may be doped with rare earth. For example, when excited by an excitation source of 975 nm infrared light, $Er^{3+}$:oxyfluoride glasses ($Al_2O_3$, $CdF_2$, $PbF_2$ and $YF_3$) may emit 545 nm, 660 nm and 800 nm visible light.

Preferably, in the halides material system other than fluorine compounds, $Cs_3(RE)_2X_9$ type compound may be employed as an upconversion luminescent material, and $Cs_3(RE)_2X_9$ type compound may upconvert infrared light to visible light. Wherein, Cs is cesium, RE represents rare earth ion, X represents Cl, Br and I, etc.

Preferably, $Cs_3(RE)_2X_9$ type compound may be halides doped with erbium ion ($Er^{3+}$) and ytterbium ion ($Yb^{3+}$), for example, $Er^{3+}$:$Cs_3Lu_2Br_9$ or $Yb^{3+}$:$Cs_3(RE)_2X_9$. $Er^{3+}$:$Cs_3Lu_2Br_9$ (erbium-doped lutetium cesium bromide) may up-convert infrared light with an exciting wavelength of 980 nm to visible light with a wavelength of about 500 nm; $Yb^{3+}$:$Cs_3(RE)_2X_9$ may up-convert infrared light with an exciting wavelength of 1500 nm to visible light, wherein Lu is lutetium element, RE represents a rare earth ion, and X represents Cl, Br and I, etc.

Additionally, a $Eu^{3+}$ and $Yb^{3+}$ co-doped poly-component silicic acid glasses material made by sol-gel method may up-convert 973 nm near infrared light to orange visible light; $Tm^{3+}$ (thulium ion)-doped silicate glasses made by sol-gel method can convert infrared light to blue light. At room temperature, $Nd_2(WO_4)_3$ (neodymium tungstate) crystal may up-convert infrared light with an exciting wavelength of 808 nm to visible light with a wavelength of 457 nm and 657 nm. At room temperature, $Er^{3+}$:$YVO_4$ (erbium-doped yttrium vanadate) single crystal may up-convert infrared light with an exciting wavelength of 808 nm to 550 nm visible light; and at room temperature, $Sm^{3+}$: $Y_3Al_5O_{12}$ (samarium-doped yttrium aluminum garnet) crystal may up-convert infrared light with an exciting wavelength of 925~950 nm to visible light.

Mode 2:

Preferably, the lenses 21 of the dedicated spectacles 2 shown in FIG. 1 are optical doubling frequency crystal wafers. The optical doubling frequency crystal wafers may convert infrared light into visible light.

During specific implementation process, the optical doubling frequency wafer is manufactured by optical doubling frequency crystal. Optical doubling frequency phenomenon is also referred to as optical second harmonic, which refer to a phenomenon in which a fundamental frequency light with a frequency of ω is converted to a doubling frequency light with a frequency of 2ω due to the interaction between light and a non-linear medium (generally, crystal). Such an optical doubling frequency phenomenon is a second-order non-linear optical effect.

After passing through the optical doubling frequency wafer, light with an exciting wavelength in the infrared light waveband may be converted to visible light.

Preferably, the optical doubling frequency wafer may be made of potassium titanium oxide phosphate (kTP) crystal. After passing through the optical doubling frequency wafer made of potassium titanium oxide phosphate (kTP) crystal, infrared light with an exciting wavelength of 1064 nm may be converted into visible light with a wavelength of about 532 nm (green light).

For near infrared fundamental frequency light, typical optical doubling frequency crystal for manufacturing optical doubling frequency wafers includes crystals such as ammonium dihydrogen phosphate (ADP), potassium dihydrogen phosphate (KDP), potassium dideuterium phosphate (DKDP), cesium dideuterium arsenate (DCDA) and cesium dihydrogen arsenate (CDA), etc., and the optical conversion efficiency may be as high as 30%-50%.

The dedicated spectacles 2 in the display system shown in FIG. 1 has been illustrated above, and an infrared display apparatus according to the invention will be introduced below.

The infrared display apparatus 1 shown in FIG. 1 is an infrared display apparatus that includes an infrared backlight module; or, it may be an infrared display apparatus that does not include an infrared backlight module. An infrared display apparatus that does not include an infrared backlight module realizes the display of an image via an infrared display device that actively emits light.

The infrared display apparatus according to the invention will be illustrated by different embodiments below.

Embodiment 1

The infrared display apparatus is an infrared display apparatus that includes an infrared backlight module.

In order to well control the transmission amount of infrared light, first of all, a light valve device is provided in this embodiment, wherein the light valve device at least includes: a first liquid crystal cell and a second liquid crystal cell that are oppositely disposed to each other; wherein, the first liquid crystal cell and the second liquid crystal cell are both formed by two substrates that are oppositely arranged, and alignment films with parallel or antiparallel alignment directions are formed on the inside the two substrates respectively; moreover, cholesteric liquid crystals with opposite arrangement and rotation directions are filled in the first liquid crystal cell and the second liquid crystal cell respectively.

Next, this embodiment further provides an infrared display apparatus comprising the above light valve device. The infrared display apparatus comprises a display panel and an infrared backlight module, wherein the display panel comprises the above light valve device; in the light valve device of the infrared display apparatus, the first liquid crystal cell and the second liquid crystal cell are further set with two pixel arrays in one-to-one correspondence, for controlling the light transmittance of each pixel.

Figure 5:
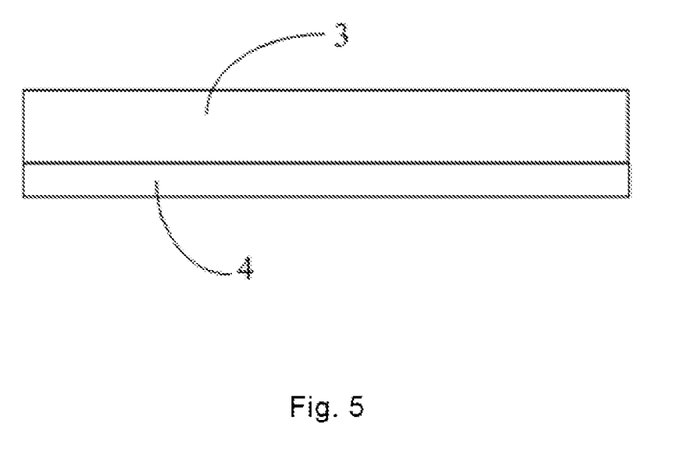
FIG. 5 is a schematic sectional view of an infrared display apparatus according to Embodiment 1 of the invention.

Specifically, referring to FIG. 5, it is a schematic sectional view of an infrared display apparatus according to Embodiment 1, which comprises:

a display panel 3, and an infrared backlight module 4 that is located directly under the display panel 3 and is fixed and connected with the display panel 3;

the display panel 3 comprises a light valve device; the light valve device comprises a first liquid crystal cell and a second liquid crystal cell that are oppositely disposed to each other; the first liquid crystal cell is set with a pixel array; and the second liquid crystal cell is set with a pixel array corresponding to the pixel array in the first liquid crystal cell. In FIG. 5, no pixel array or light valve device is shown.

It should be noted that the pixel mentioned in the invention is a pixel corresponding to each sub-pixel unit.

The above light valve device and pixel array will be introduced in detail below.

Figure 6:
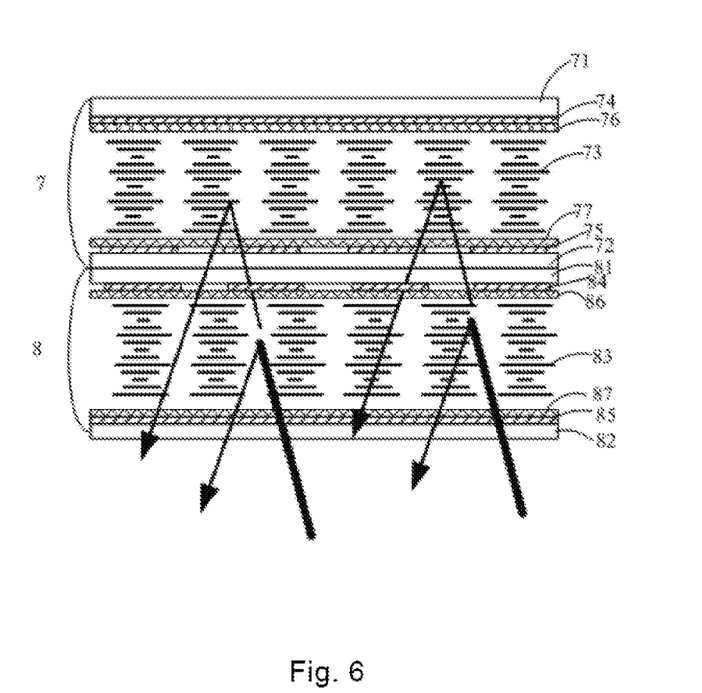

Referring to FIG. 6, the light valve device according to an embodiment of the invention includes: a first liquid crystal cell 7 and a second liquid crystal cell 8 that are oppositely disposed to each other;

the first liquid crystal cell 7 includes: a first substrate 71 and a second substrate 72 that are oppositely disposed to each other; liquid crystal molecules 73 located between the first substrate 71 and the second substrate 72; a first conductive electrode 74 and a second conductive electrode 75 located on the sides of the first substrate 71 and the second substrate 72 respectively for controlling the deflection of liquid crystal molecule 73 in the first liquid crystal cell 7; and a first alignment film 76 and a second alignment film 77 located on the first conductive electrode 74 and the second conductive electrode 75 respectively;

the second liquid crystal cell 8 includes: a third substrate 81 and a fourth substrate 82 that are oppositely disposed to each other; cholesteric liquid crystal molecules 83 located between the third substrate 81 and the fourth substrate 82; a third conductive electrode 84 and a fourth conductive electrode 85 located respectively on the sides of the third substrate 81 and the fourth substrate 82 that are adjacent to the liquid crystal molecule 83 for controlling the deflection of the liquid crystal molecules 83 in the third liquid crystal cell 8; and a third alignment film 86 and a fourth alignment film 87 located on the third conductive electrode 84 and the fourth conductive electrode 85 respectively.

wherein, the first liquid crystal cell 7 is filled with levogyric cholesteric liquid crystal molecules, and the second liquid crystal cell 8 is filled with dexiotropous cholesteric liquid crystal molecules; or, the first liquid crystal cell 7 is filled with dexiotropous cholesteric liquid crystal molecules, and the second liquid crystal cell 8 is filled with levogyric cholesteric liquid crystal molecules;

the alignment direction of the first alignment film 76 is parallel or antiparallel to that of the second alignment film 77, and the alignment direction of the third alignment film 86 is parallel or antiparallel to that of the fourth alignment film 87.

It should be noted that, the alignment direction of the first alignment film 76 is parallel to that of the second alignment film 77 means that the friction direction of the first alignment film 76 is parallel to that of the second alignment film 77, and that the alignment direction of the first alignment film 76 is antiparallel to that of the second alignment film 77 means that the friction direction of the first alignment film 76 is antiparallel to that of the second alignment film 77.

The size of the light valve device in the display panel is comparable to the infrared backlight module.

Preferably, in order to reduce the thickness of the display panel and save the cost, the second substrate 72 in the first liquid crystal cell 7 and the third substrate 81 in the second liquid crystal cell 8, which is adjacent to the second substrate 72, are one and the same substrate, which is a common substrate.

A display panel that includes the above light valve device and pixel array will be illustrated below.

Figure 7:
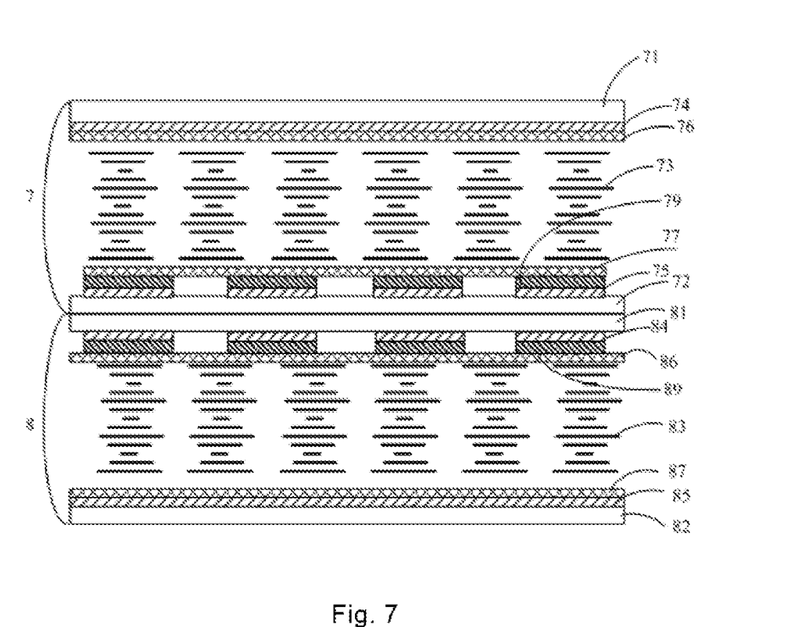
FIG. 7 is a structural representation of the light valve device shown in FIG. 6 that has sub-pixel units.

Referring to FIG. 7, in the display panel of this embodiment, a pixel array (which corresponds to a plurality of sub-pixel units 79 and a plurality of sub-pixel units 89 in FIG. 7) is set in the first liquid crystal cell 7 and the second liquid crystal cell 8 respectively.

The pixel array in the first liquid crystal cell 7 may be set on the first substrate 71, and it may also be set on the second substrate 72; the pixel array in the second liquid crystal cell 8 may be set on the third substrate 81, and it may also be set on the fourth substrate 82.

Specifically, the pixel array in the first liquid crystal cell 7 may be set between the first conductive electrode 74 and the first alignment film 76, or it may be set between the second conductive electrode 75 and the second alignment film 77.

The pixel array in the second liquid crystal cell 8 may be set between the third conductive electrode 84 and the third alignment film 86, or it may be set between the fourth conductive electrode 85 and the fourth alignment film 87.

For easy wiring of the pixel array, the pixel arrays located in different liquid crystal cells are positioned as near as possible. Preferably, referring to FIG. 7, the pixel array in the first liquid crystal cell 7 is set on the second substrate 72, and the pixel array in the second liquid crystal cell 8 is set on the third substrate 81.

During specific implementation process, when the second substrate 72 and the third substrate 81 are one and the same common substrate, the pixel array may be set on the two sides of the common substrate.

Preferably, each pixel in the first liquid crystal cell and the second liquid crystal cell comprises a switching device for controlling on and off of the pixel, for example, a thin-film transistor (TFT);

In each pixel of the first liquid crystal cell, the first conductive electrode is a common electrode, which is connected with a supply source; and the second conductive electrode is a pixel electrode, which is connected with a display signal control end via a switching device. During specific implementation process, a voltage $V_1$ is applied between the pixel electrode and the common electrode, and an electric field is formed to controlling the deflection of liquid crystal molecules in the first liquid crystal cell.

In each pixel of the second liquid crystal cell, the fourth conductive electrode is a common electrode, which is connected with a supply source; and the third conductive electrode is a pixel electrode, which is connected with a display signal control end via a switching device. During specific implementation process, a voltage $V_2$ is applied between the pixel electrode and the common electrode, and an electric field is formed to control the deflection of liquid crystal molecules in the second liquid crystal cell.

Referring to FIG. 7, preferably, the vertical-direction projections of the sub-pixel unit 79 in the first liquid crystal cell 7 and the sub-pixel unit 89 in the second liquid crystal cell 8 are overlapped with each other, that is, the location of the sub-pixel unit 79 in the first liquid crystal cell 7 corresponds to that of the sub-pixel unit 89 in the second liquid crystal cell 8.

During specific implementation process, for example, when the switching device is a TFT, the voltage of the pixel electrode may be provided by a data signal line connected with the source electrode of the TFT, and the voltage of the common electrode may be provided by the supply source.

It should be noted that, the values of the voltage $V_1$ and the voltage $V_2$ may be the equal or unequal, which depends on specific situations.

The light valve device according to Embodiment 1 is a cholesteric liquid crystal light valve device.

Theory by which the cholesteric liquid crystal light valve device controls the light transmittance of the infrared light from the infrared backlight module will be illustrated below.

Specifically, it will be illustrated by taking the case in which the first liquid crystal cell 7 is filled with levogyric cholesteric liquid crystal molecules and the second liquid crystal cell 8 is filled with dexiotropous cholesteric liquid crystal molecules as an example.

As shown in FIG. 7, when no voltage is applied between each conductive electrode on the two sides of the first liquid crystal cell 7 and no voltage is applied between each conductive electrode on the two sides of the second liquid crystal cell 8, the major axes of the levogyric cholesteric liquid crystal molecules filled in the first liquid crystal cell 7 and the dexiotropous cholesteric liquid crystal molecules filled in the second liquid crystal cell 8 are arranged along the direction parallel to the first liquid crystal cell 7 and the second liquid crystal cell 8. After passing through the second liquid crystal cell 8, dexiotropous polarized light from the infrared backlight module will be totally reflected by dexiotropous cholesteric liquid crystal molecules; levogyric polarized light from the infrared backlight module fully transmit through the second liquid crystal cell 8, and the levogyric polarized light is totally reflected by the levogyric cholesteric liquid crystal molecules of the first liquid crystal cell 7. That is, when no voltage is applied on each conductive electrode on the two sides of the first liquid crystal cell 7 and the second liquid crystal cell 8, the liquid crystal molecules in the first liquid crystal cell 7 and the second liquid crystal cell 8 will not be deflected, and the light beams from the infrared backlight module will be all reflected back.

Figure 8:
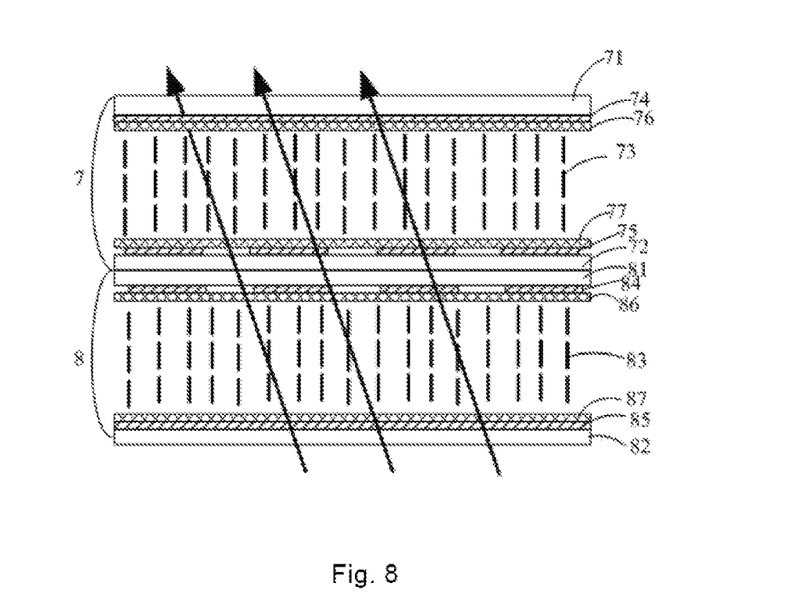

As shown in FIG. 8, when a certain voltage is applied between the third conductive electrode 84 and the fourth conductive electrode 85, the liquid crystal molecules in the second liquid crystal cell 8 will be deflected; when a certain voltage is applied between the first conductive electrode 74 and the second conductive electrode 75, the liquid crystal molecules in the first liquid crystal cell 7 will be deflected. If the voltage applied between the third conductive electrode 84 and the fourth conductive electrode 85 and the voltage applied between the first conductive electrode 74 and the first conductive electrode 75 are large enough to cause that the major axes of the liquid crystal molecules in the first liquid crystal cell 7 and the second liquid crystal cell 8 is vertical to the substrates of the first liquid crystal cell 7 and the second liquid crystal cell 8, at this time, the light beams from the infrared backlight module may fully pass through the liquid crystal molecules and be transmitted to the light outgoing side of the infrared display apparatus.

The light transmittance of the infrared light passing through the light valve device is controlled by controlling the deflection degree of liquid crystal molecules in the light valve device.

Preferably, the first conductive electrode and the second conductive electrode cover the entire first liquid crystal cell, and the third conductive electrode and the fourth conductive electrode cover the entire second liquid crystal cell.

Preferably, the first conductive electrode, the second conductive electrode, the third conductive electrode and the fourth conductive electrode are transparent conductive films. For example, they may be transparent conductive films such as ITO or IZO.

During specific implementation process, by controlling the helical pitch of the cholesteric phase liquid crystal, the reflection of infrared light by the cholesteric phase liquid crystal may be controlled. Theory by which the reflection of infrared light by the cholesteric phase liquid crystal is controlled via controlling the helical pitch of the cholesteric phase liquid crystal will be illustrated in detail below Under the irradiation of incident light, the cholesteric phase liquid crystal will selectively reflect light of a certain wavelength. As indicated by experiments, such reflection of light beams complies with the Bragg formula for crystal diffraction, thus such reflection is also referred to as Bragg reflection.

The wavelength λ reflected selectively meet the formula (1) below:

$$\lambda = \Delta n * p \qquad (1)$$

Wherein, Δn is the birefringence of cholesteric phase liquid crystal molecules, p is the helical pitch of the cholesteric phase liquid crystal. When the birefringence and the helical pitch of cholesteric phase liquid crystal molecules are defined, the cholesteric phase liquid crystal will selectively reflect light of a certain wavelength under the irradiation of incident light.

The birefringence of cholesteric phase liquid crystal molecules has a fixed value, and the reflection of light with different wavelengths by the cholesteric phase liquid crystal is changed by changing the helical pitch of the cholesteric phase liquid crystal.

Preferably, the value of helical pitch p may be adjusted by the concentration C of chiral additives in the cholesteric phase liquid crystal. The relation between the helical pitch p and the concentration C of chiral additives meets the formula (2) below:

$$P = 1/(HTP * C) \qquad (2)$$

Wherein, HTP (Helical Twisting Power of the chiral dopant) is an intrinsic twisting energy constant of liquid crystal.

The value of helical pitch p is determined by adding chiral additives of a certain concentration into the cholesteric phase liquid crystal molecules, so as to realize the reflection by the cholesteric phase liquid crystal of light in the infrared wavelength range corresponding to the helical pitch p determined.

According to the above theory, by setting chiral additives of different concentrations in different regions of the cholesteric phase liquid crystal layer, the helical pitches of liquid crystal molecules in different regions of the cholesteric phase liquid crystal layer may be made to distribute as gradient values, thereby light in a preset wavelength range may be reflected. Thus, by setting the wavelength range of light selectively reflected by the cholesteric phase liquid crystal layer as larger than the wavelength range of the light emitted by the light source, the utilization of light emitted by the light source may be improved.

Wherein, during the setting of chiral additives of different concentrations in different regions of the cholesteric phase liquid crystal layer, ultraviolet light may be employed to irradiate a mixture of liquid crystal molecules, polymerisable monomer, ultraviolet light absorbent and photoinitiator, which is doped with the chiral additive, and because the chiral additive has different molecule diffusion velocities under different ultraviolet light strengths, the concentration of the chiral additive in the liquid crystal molecules that are adjacent to the ultraviolet light source may be made high, and the concentration of the chiral additive in the liquid crystal molecules that is away from the ultraviolet light source may be made low, and the helical pitch of the cholesteric phase liquid crystal in different regions may be fixed via the polymerization of the polymerisable monomer, so that a stable gradient distribution of liquid crystal helical pitches in different regions is formed. There also exist other preparation modes to form the gradient distribution of cholesteric phase liquid crystal helical pitches, and it will not be described again here.

By forming liquid crystal with different helical pitch gradients in the cholesteric phase liquid crystal of each light valve device, the cholesteric phase liquid crystal in each light valve device will reflect the infrared wide wave in a certain range.

When the helical pitches of the cholesteric phase liquid crystal molecules in each liquid crystal cell in the light valve device are determined, the light wavelength of the infrared light on the light outgoing side of the display panel will be determined. By adjusting the value of the helical pitch, the wavelength range of the light reflected may be controlled so as to contain the waveband range of the infrared light source used. In the invention, the types of liquid crystal molecules in the first liquid crystal cell and the second liquid crystal cell are different.

When the first liquid crystal cell is filled with levogyric cholesteric liquid crystal molecules, the levogyric cholesteric liquid crystal molecules only reflect the levogyric polarized light emitted by the infrared backlight module, and the dexiotropous polarized light is transmitted. When the second liquid crystal cell is filled with dexiotropous cholesteric liquid crystal molecules, the dexiotropous cholesteric liquid crystal molecules only reflect the dexiotropous polarized light emitted by the infrared backlight module, and the infrared light in a certain wavelength range corresponding to the helical pitch that is emitted by the infrared backlight module under the display panel emerges on the light outgoing side of the display panel after passing through the first liquid crystal cell and the second liquid crystal cell.

It should be noted that, the invention relates to a cholesteric liquid crystal light valve device that includes the first liquid crystal cell and the second liquid crystal cell, wherein the first liquid crystal cell or the second liquid crystal cell includes: two substrates arranged opposite to form a cell; and cholesteric liquid crystal located between the two substrates. When the first liquid crystal cell and the second liquid crystal cell are stacked, preferably, the first liquid crystal cell and the second liquid crystal cell may be realized via three substrates. That is, the substrate that is nearest to the first liquid crystal cell and the second liquid crystal cell may be realized by one and the same substrate.

Additionally, the above infrared display panel according to Embodiment 1 of the invention (as shown in FIG. 5) does not include a color filter. Thus, another substrate that is oppositely disposed to the display panel 3 may also be set above the display panel 3, and this substrate may more effectively protect the entire display apparatus.

An infrared backlight module 4 in the infrared display apparatus according to Embodiment 1 of the invention (i.e., as shown in FIG. 5) will be introduced in detail below. The infrared backlight module 4 at least includes an infrared light source that emits infrared light.

Preferably, the infrared light source may be set in straight down type mode or side light type mode.

Preferably, the infrared light source in the infrared backlight module is an infrared organic light-emitting diode (infrared OLED, for short) or an infrared inorganic light-emitting diode (infrared LED, for short).

The number of infrared LEDs or infrared OLEDs set in the infrared light source is determined as required.

The infrared LED is a spot light source, and the infrared OLED is a surface light source. The infrared light source consisted of infrared LEDs or infrared OLEDs may be set in straight down type mode or side light type mode.

Preferably, when the infrared light source is a group of infrared OLEDs, the infrared light source will be set in straight down type mode. The region covered by the infrared OLEDs is no less than the display region of the infrared display apparatus, so that a surface light source that provides a uniform light intensity on the entire back plate may be realized.

Preferably, the infrared LED is made of a material with high infrared radiation efficiency. For example, a PN junction may be made by using a GaAs material with high infrared radiation efficiency, and the PN junction is excited to emit infrared light by applying a forward bias to the PN junction to feed a current.

The wavelength of an infrared LED is generally about 850 nm, and if it is viewed at a short distance, it will be found that an infrared lamp emits dark red light. However, because 850 nm approaches the visible light, a 850 nm projection lamp often generates a few visible light components, and the light looks red with a slight red storm phenomenon.

Preferably, the wavelength of an infrared LED may be set as about 940 nm. When a 940 nm infrared LED is employed, the LED emits no visible light, and no red storm occurs, thus the display image will be more concealed. For example, for a GaAs infrared luminescence diode, the peak luminescence wavelength is 940-950 nm, while the light wavelength that is invisible to human eyes is above 900 nm approximately.

The infrared OLED has a multilayer structure. It at least includes an anode, a cathode and a luminescent layer located between the anode and the cathode. The anode, the luminescent layer and the cathode are stack in turn to form a surface light source.

Preferably, the luminescent layer of the infrared OLED is an organic luminescent layer with a luminescent material that emits infrared light.

Preferably, the organic luminescent layer may have a Alq3:CuPc/DCM multilayer structure. The whole structure of the infrared OLED device may be ITO (anode)/NPB(35 nm)/Alq3:CuPc(32 nm)/BCP(15 nm)/Alq3 (20 nm)/Al (cathode). In the infrared OLED device, the primary mechanism is the near infrared electroluminescence forster energy transfer mechanism of CuPc, and the secondary mechanism is the carrier trapping mechanism and the Dexter energy transfer mechanism.

Wherein, Alq3 is 8-hydroxyquinolinolato-aluminum, CuPc is phthalocyanine blue, DCM is dichloromethane, NPB is a hole transporting layer, BCP is a hole blocking layer, and DCM is a red fluorescent dye. Preferably, the organic luminescent layer is made of a rare-earth element complex that emits red light. For example, because third-order rare earth erbium ion ($Er^{3+}$) complex has a luminescence feature in the near infrared range, and it may react with a ligand of ring-type organic matter and generate a series of rare earth organic complexes, which has a good compatibility with materials such as organic compound and macromolecule materials, so it is applicable for infrared luminescence display application; for an $Er(BMA)_3(Phen)$ complex that takes Phen (1,10-phenanthroline 1) and butyl methacrylate (BMA) as organic ligands, the peak fluorescence emissive power appears at 1536 nm.

Preferably, the organic luminescent layer may also be made of an infrared organic non-ion luminescent material. By adjusting and controlling the structure of electron donor, electron acceptor and linking group, the infrared organic non-ion luminescent material may make the longest absorbing wavelength of molecules reach above 1.1 micrometer, and the photo-emitting wavelength reach about 1.5 micrometer.

The display panel 3 and the infrared backlight module 4 in the infrared display apparatus shown in FIG. 5 have been introduced in the above entire Embodiment 1.

It should be noted that the infrared display apparatus according to Embodiment 1 of the invention may realize the display of an infrared image without the need of any polarizer sheets. Moreover, the infrared display apparatus according to Embodiment 1 of the invention may realize the image display of a solid color without the need of color filters.

Preferably, the infrared display apparatus according to the invention is not limited to the display apparatus provided in Embodiment 1. It may also be an infrared display apparatus without infrared backlight modules according to Embodiment 2 below, wherein an infrared LED or an infrared OLED actively emits light.

Embodiment 2

An infrared display apparatus that includes a display panel actively emitting infrared light.

Figure 9:
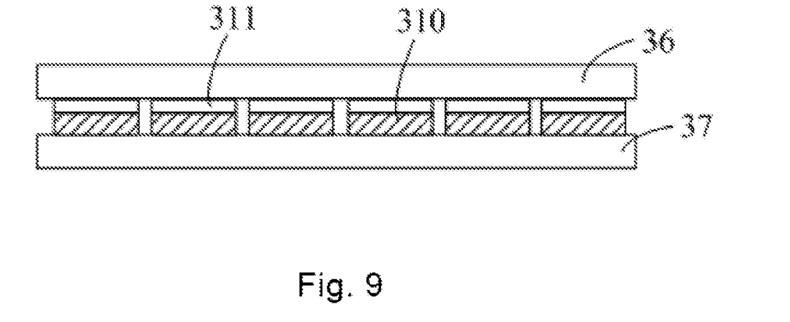
FIG. 9 is a schematic sectional view of an infrared display apparatus according to Embodiment 2 of the invention.

Referring to FIG. 9, the display panel comprises:

a first substrate 37 and a second substrate 36 that are oppositely disposed to each other;

a pixel array located on the side of the first substrate 37 that is adjacent to the second substrate 36 (no pixel array is embodied in the sectional view shown in FIG. 9); and an infrared luminescence device 310 that is set in each pixel region on the first substrate 37 and is connected with each pixel in one-to-one correspondence.

Preferably, each pixel includes a switching device for controlling on and off of the pixel (for example, TFT) and a pixel electrode connected with the switching device;

The infrared luminescence device 310 includes a cathode and an anode, wherein one of the cathode and the anode is connected with the pixel electrode, and the other is connected with a supply source.

During specific implementation process, the infrared luminescence device in each pixel corresponds to a pixel drive circuit, which drives the infrared luminescence device to emit light under the action of signal voltages provided by a gate scanning line and a data signal line.

Preferably, the infrared luminescence device is consisted of at least two infrared LEDs according to the above Embodiment 1 that are connected in series with each other; or, the infrared luminescence device is consisted of at least two infrared OLEDs according to the above Embodiment 1 that are connected in series with each other.

Preferably, the luminance of each pixel is controlled by the luminance of the infrared luminescence device. The luminance of the infrared LED may be controlled by the current thereof. By the same token, the luminance of the infrared OLED may be controlled by the current thereof. The pixel resolution of the display apparatus is determined by the number of infrared luminescence devices. During specific implementation process, the luminance of the infrared luminescence device is independently controlled by the image signal voltage so as to correctly display the information.

Preferably, referring to FIG. 9, the infrared display apparatus according to Embodiment 2 of the invention further comprises:

microlens 311 located on the light-exiting surface of each infrared luminescence device 310, for example, a micro-convex lens; the microlens 311 may improve the vertical directivity of the light (the vertical directivity means the directivity of light on the light outgoing side of the infrared display apparatus). The microlens 311 may be fixed and connected with the infrared luminescence device 310.

Embodiment 3

Figure 10:
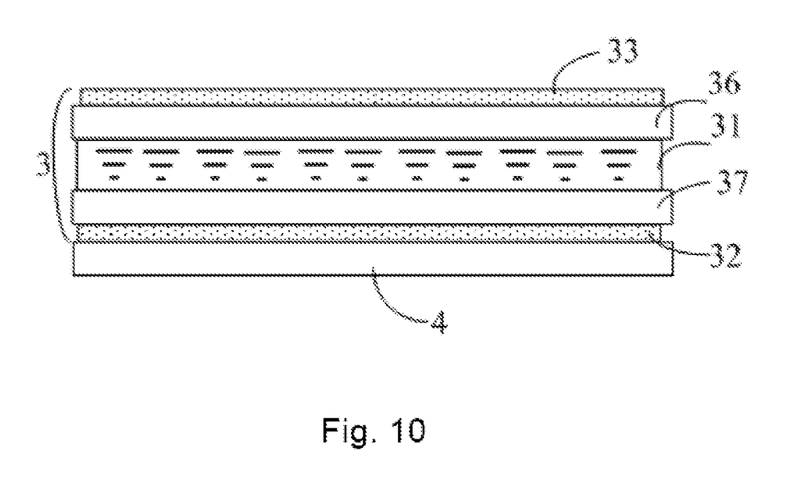
FIG. 10 is a schematic sectional view of an infrared display apparatus according to Embodiment 3 of the invention.

The display apparatus according to the invention may also be an infrared display apparatus as shown in FIG. 10.

The infrared display apparatus includes:

a display panel 3 and an infrared backlight module 4 that are oppositely disposed to each other;

wherein, the display panel 3 comprises:

a first substrate 37, and a second substrate 36 that is oppositely disposed to the first substrate 37;

a liquid crystal layer 31 located between the first substrate 37 and the second substrate 36;

a plurality of sub-pixel units located on the first substrate 37 (no sub-pixel unit is not embodied in the sectional view shown in FIG. 10), wherein each sub-pixel unit is set with a thin-film transistor TFT that functions as a pixel switch; and a second infrared polarizer sheet 33 located on the side of the second substrate 36 that is away from the liquid crystal, and a first infrared polarizer sheet 32 located on the side of the first substrate 37 that is away from the liquid crystal; wherein the optical axis direction of the first infrared polarizer sheet 32 is vertical to that of the second infrared polarizer sheet 33.

The display panel also includes a pixel electrode and a common electrode, a voltage is applied between the pixel electrode and the common electrode to form an electric field, which controls the deflection of the liquid crystal molecule. The mode for setting the liquid crystal layer, the pixel electrode and the common electrode is the same as that of the existing display panel, so it will not be described again here.

The display panel according to Embodiment 3 controls the light transmittance of a light beam by controlling the deflection of liquid crystal molecules via the pixel electrode and the common electrode. The first infrared polarizer sheet and second infrared polarizer sheet control the light beam from the infrared backlight module to pass through the display panel and emerge on the light outgoing side of the display panel.

Preferably, the liquid crystal in the liquid crystal layer 31 may be liquid crystal that has various display modes and is applicable for TFT-LCD.

The display mode of TFT-LCD mainly includes Twisted Nematic (TN) mode, Vertical Alignment (VA) mode, In-Plane-Switching (IPS) mode and ADvanced Super Dimension Switch (ADSDS, and ADS for short) mode, etc.

It should be noted that, when the display mode of a TFT-LCD is TN mode or VA mode, a common electrode will be further set on the second substrate of the display panel, wherein the common electrode and the pixel electrode in the sub-pixel unit form an electric field to control the deflection of liquid crystal molecules so as to realize the control on the light transmittance. When the display mode of the TFT-LCD is IPS mode or ADS mode, the common electrode will be set on the first substrate, and the common electrodes and the pixel electrodes on different layers of the first substrate form a transverse electric field or a multidimensional electric field to control the deflection of liquid crystal molecules so as to realize the control on light transmittance.

For the display apparatus as shown in FIG. 10, when the infrared light from the infrared backlight module 4 passes through the first infrared polarizer sheet 32, the polarized light consistent with the transmission axis direction of the optical axis of the first infrared polarizer sheet 32 will pass, and the polarized light adjusts it polarization form and polarization direction via the liquid crystal molecules of the liquid crystal layer 31, so that the light transmittance thereof after passing the second infrared polarizer sheet 33 may be effectively controlled, and it will emerge on the light outgoing side of the infrared display apparatus.

Preferably, the light valve device according to Embodiment 1 of the invention may also be realized via conductive black particles, wherein the black particles may move under the action of an electric field, and the throughput of light beams is determined by the size of the gaps between the black particles.

The embodiments of the invention provide an infrared display apparatus and dedicated spectacles for the infrared display apparatus. The dedicated spectacles may convert an infrared display image from the infrared display apparatus into a visible light image that can be seen by human eyes; but for naked eyes, only a normal black display screen of the infrared display apparatus can be seen, so that the image displayed by the infrared display apparatus will be more concealed.

Apparently, various modifications and variations may be made to the invention by one skilled in the art without departing from the spirit and scope of the invention. Therefore, if these modifications and variations of the invention fall into the scope of the claims and equivalent technologies of the invention, such modifications and variations will be intended to be encompassed by the invention.

What is claimed is:

1. An infrared light valve device, comprising a first liquid crystal cell and a second liquid crystal cell that are oppositely disposed to each other;
    wherein the first liquid crystal cell and the second liquid crystal cell are both formed by two substrates that are oppositely arranged, and alignment films with parallel or antiparallel alignment directions are formed on the inside the two substrates respectively;
    cholesteric liquid crystals with opposite arrangement and rotation directions are filled in the first liquid crystal cell and the second liquid crystal cell respectively; and
    with a light-exiting direction of the first liquid crystal cell being the same as that of the second liquid crystal cell, and the first liquid crystal cell and the second liquid crystal cell jointly control a light transmittance of an infrared light at the light-existing direction when the infrared light valve is at work.

2. The infrared light valve device according to claim 1, wherein,
    the first liquid crystal cell comprises a first substrate and a second substrate that are oppositely disposed to each other, cholesteric liquid crystal molecules located between the first substrate and the second substrate, a first conductive electrode and a second conductive electrode located on the first substrate and the second substrate respectively for controlling the deflection of liquid crystal molecules in the first liquid crystal cell, and a first alignment film and a second alignment film located on the first conductive electrode and the second conductive electrode respectively;

the second liquid crystal cell comprises a third substrate and a fourth substrate that are oppositely disposed to each other, cholesteric liquid crystal molecules located between the third substrate and the fourth substrate, a third conductive electrode and a fourth conductive electrode located on the third substrate and the fourth substrate respectively for controlling the deflection of liquid crystal molecules in the second liquid crystal cell, and a third alignment film and a fourth alignment film located on the third conductive electrode and the fourth conductive electrode respectively;

wherein, the first liquid crystal cell is filled with levogyric cholesteric liquid crystal molecules, and the second liquid crystal cell is filled with dexiotropous cholesteric liquid crystal molecules; or, the first liquid crystal cell is filled with dexiotropous cholesteric liquid crystal molecules, and the second liquid crystal cell is filled with levogyric cholesteric liquid crystal molecules;

the alignment direction of the first alignment film is parallel or antiparallel to that of the second alignment film, and the alignment direction of the third alignment film is parallel or antiparallel to that of the fourth alignment film.

3. The infrared light valve device according to claim 2, wherein, the second substrate and the third substrate are one and the same substrate, which is a common substrate; the second conductive electrode and the third conductive electrode are located on the two sides of the common substrate respectively.

4. An infrared display apparatus, comprising a display panel and an infrared backlight module, wherein, the display panel comprises a light valve device;

the infrared light valve device comprises a first liquid crystal cell and a second liquid crystal cell that are oppositely disposed to each other; the first liquid crystal cell and the second liquid crystal cell are both formed by two substrates that are oppositely arranged, and alignment films with parallel or antiparallel alignment directions are formed on the inside the two substrates respectively; and cholesteric liquid crystals with opposite arrangement and rotation directions are filled in the first liquid crystal cell and the second liquid crystal cell respectively; with a light-exiting direction of the first liquid crystal cell being the same as that of the second liquid crystal cell, and the first liquid crystal cell and the second liquid crystal cell jointly control a light transmittance of an infrared light at the light-existing direction when the infrared light valve is at work;

two pixel arrays in one-to-one correspondence are further set in the first liquid crystal cell and the second liquid crystal cell respectively, for controlling the light transmittance of each pixel.

5. The apparatus according to claim 4, wherein, the first liquid crystal cell comprises: a first substrate and a second substrate that are oppositely disposed to each other; cholesteric liquid crystal molecules located between the first substrate and the second substrate; a first conductive electrode and a second conductive electrode located respectively on the sides of the first substrate and the second substrate that are adjacent to the liquid crystal molecules, for controlling the deflection of liquid crystal molecules in the first liquid crystal cell; and a first alignment film and a second alignment film located on the first conductive electrode and the second conductive electrode respectively;

the second liquid crystal cell comprises: a third substrate and a fourth substrate that are oppositely disposed to each other; cholesteric liquid crystal molecules located between the third substrate and the fourth substrate; a third conductive electrode and a fourth conductive electrode located respectively on the sides of the third substrate and the fourth substrate that are adjacent to the liquid crystal molecules, for controlling the deflection of liquid crystal molecules in the second liquid crystal cell; and a third alignment film and a fourth alignment film located on the third conductive electrode and the fourth conductive electrode respectively;

wherein, the first liquid crystal cell is filled with levogyric cholesteric liquid crystal molecules, and the second liquid crystal cell is filled with dexiotropous cholesteric liquid crystal molecules; or, the first liquid crystal cell is filled with dexiotropous cholesteric liquid crystal molecules, and the second liquid crystal cell is filled with levogyric cholesteric liquid crystal molecules; the alignment direction of the first alignment film is parallel or antiparallel to that of the second alignment film, and the alignment direction of the third alignment film is parallel or antiparallel to that of the fourth alignment film.

6. The apparatus according to claim 5, wherein, each pixel in the first liquid crystal cell and the second liquid crystal cell comprises a switching device for controlling on and off of the pixel; and in each pixel of the first liquid crystal cell, the first conductive electrode is a common electrode, which is connected with a supply source, and the second conductive electrode is a pixel electrode, which is electrically connected with a display signal control end via a switching device;

in each pixel of the second liquid crystal cell, the fourth conductive electrode is a common electrode, which is connected with a supply source, and the third conductive electrode is a pixel electrode, which is electrically connected with a display signal control end via a switching device.

7. The apparatus according to claim 6, wherein, the second substrate and the third substrate are one and the same substrate, which is a common substrate, and the switching device in the first liquid crystal cell and the switching device in the second liquid crystal cell are located on the two sides of the common substrate respectively.

8. The apparatus according to claim 5, wherein, the infrared backlight module comprises an infrared light source, and the infrared backlight module employs a straight down type or side light type infrared light source.

9. The infrared light valve device according to claim 1, wherein, when the infrared light valve is at work, the infrared light is convertible into visible light by an upconversion lense.

10. The apparatus according to claim 4, wherein, when the infrared light valve is at work, the infrared light is convertible into visible light by an upconversion lense.

* * * * *